United States Patent
Reichelt et al.

(10) Patent No.: US 9,240,795 B2
(45) Date of Patent: Jan. 19, 2016

(54) APPARATUS AND METHODS FOR PHASE-LOCKED LOOP OSCILLATOR CALIBRATION AND LOCK DETECTION

(71) Applicant: Silicon Laboratories, Inc., Austin, TX (US)

(72) Inventors: Pål Øyvind Reichelt, Sandvika (NO); Øyvind Janbu, Oslo (NO)

(73) Assignee: Silicon Laboratories, Inc., Austin, TX (US)

( * ) Notice: Subject to any disclaimer, the term of this patent is extended or adjusted under 35 U.S.C. 154(b) by 58 days.

(21) Appl. No.: 14/169,813

(22) Filed: Jan. 31, 2014

(65) Prior Publication Data

US 2015/0222278 A1    Aug. 6, 2015

(51) Int. Cl.
*H03L 7/095* (2006.01)
*H03L 7/18* (2006.01)
*H03K 5/135* (2006.01)

(52) U.S. Cl.
CPC .............. *H03L 7/095* (2013.01); *H03K 5/135* (2013.01); *H03L 7/18* (2013.01)

(58) Field of Classification Search
CPC ........... H03L 7/00; H03L 7/18; H03L 7/0891; H03L 7/0814; H03K 5/135
USPC .................... 327/147, 156, 158, 161
See application file for complete search history.

(56) References Cited

U.S. PATENT DOCUMENTS

| | | | |
|---|---|---|---|
| 2008/0231324 A1* | 9/2008 | Liu et al. | 327/12 |
| 2015/0061737 A1* | 3/2015 | Abbasi | H03L 7/1075 327/157 |

* cited by examiner

*Primary Examiner* — John Poos
(74) *Attorney, Agent, or Firm* — Miller, Matthias & Hull LLP

(57) ABSTRACT

A system and method of calibrating a phase-locked loop (PLL) having at least a phase detector, a frequency divider and a local oscillator are provided. The disclosed example includes generating a lock window signal based on a feedback signal generated by the frequency divider where the lock window signal may form an active lock window relative to each significant edge of the feedback signal, generating a sampled window signal based on samples of the lock window signal at each significant edge of a reference signal, and estimating a phase offset between the reference signal and the feedback signal based on a number of consecutive samples of the sampled window signal that are active.

20 Claims, 2 Drawing Sheets

APPARATUS AND METHODS FOR PHASE-LOCKED LOOP OSCILLATOR CALIBRATION AND LOCK DETECTION

TECHNICAL FIELD

The present disclosure relates generally to phase-locked loops (PLLs) and, more particularly, to oscillator calibration and lock detection of PLLs.

BACKGROUND

Phase-locked loop circuits are commonly used in applications that rely on stable and programmable output frequencies. A typical PLL may be provided in conjunction with a voltage-controlled oscillator (VCO) to produce a desired output frequency that is phase-locked to a reference frequency from a local oscillator, for example. More specifically, a PLL may include a feedback divider for generating an output frequency as a function of programmable ratios and the VCO output, and a phase detector for monitoring phase differences between the reference frequency and the divided output frequency. In addition, a PLL may include a charge pump for generating a signal that is proportional to the phase difference assessed by the phase detector. In response to the charge pump signal, a loop filter of the PLL can be used to output the appropriate voltage or current to adjust the VCO and the output frequency thereof to match the phase of the reference frequency.

Due to the initially arbitrary phase-offset, there are certain delays inherently associated with the phase-matching processes of conventional PLL circuits. For instance, during frequency calibration and phase-lock detection, there can be inherent delays associated with determining whether the output frequency is higher or lower with respect to the reference frequency, and determining whether the phase-offset exceeds predefined limits. Such delays can adversely affect not only the overall performance of the PLL, but may also contribute to the collective delays associated with other devices relying on the accuracy of the PLL. These delays may further translate into an increase in overall energy consumption, and in relation to mobile or portable electronic devices, a decrease in battery life. A need therefore exists for more efficient PLLs.

SUMMARY OF THE DISCLOSURE

In one aspect of the present disclosure, a method of calibrating a PLL having at least a phase detector, a frequency divider and a local oscillator is provided. The method includes generating a lock window signal based on a feedback signal generated by the frequency divider, where the lock window signal forms an active lock window relative to each significant edge of the feedback signal. A sampled window signal is generated based on samples of the lock window signal at each significant edge of a reference signal, and a frequency offset between the reference signal and the feedback signal is estimated based on a number of consecutive samples of the sampled window signal that are active.

In another aspect of the present disclosure, a method of calibrating a PLL having at least a phase detector, a frequency divider and a local oscillator is provided. The method includes sampling a lock window signal at each significant edge of a reference signal, where the lock window signal may form an active lock window centered about each significant edge of a feedback signal generated by the frequency divider, and determining a number of consecutive samples of the lock window signal that are active. The method further updates the local oscillator based on a state of the feedback signal relative to the reference signal if the number of consecutive active samples is less than a predefined lower limit corresponding to excessive phase offset, and aborts calibration measurements if the number of consecutive active samples is greater than a predefined upper limit corresponding to phase-lock.

In yet another aspect of the present disclosure, a PLL device is provided. The PLL device in this embodiment includes a local oscillator, a feedback divider, a phase detector and a calibration controller. The local oscillator is configured in this embodiment to generate an output signal. The feedback divider is in turn configured to generate a feedback signal and a lock window signal in response to the output signal. The phase detector operates the local oscillator based on a comparison between a reference signal and the feedback signal, and generates a sampled window signal based on samples of the lock window signal with the reference signal. The calibration controller is configured in this embodiment to determine a number of consecutive samples in the sampled window signal that are active, and to estimate a phase offset based on the number of consecutive active samples.

DETAILED DESCRIPTION

Reference will now be made in detail to specific embodiments or features, which are illustrated in the accompanying drawings. Generally, corresponding reference numbers will be used throughout the drawings to refer to the same or corresponding parts.

Figure 1:
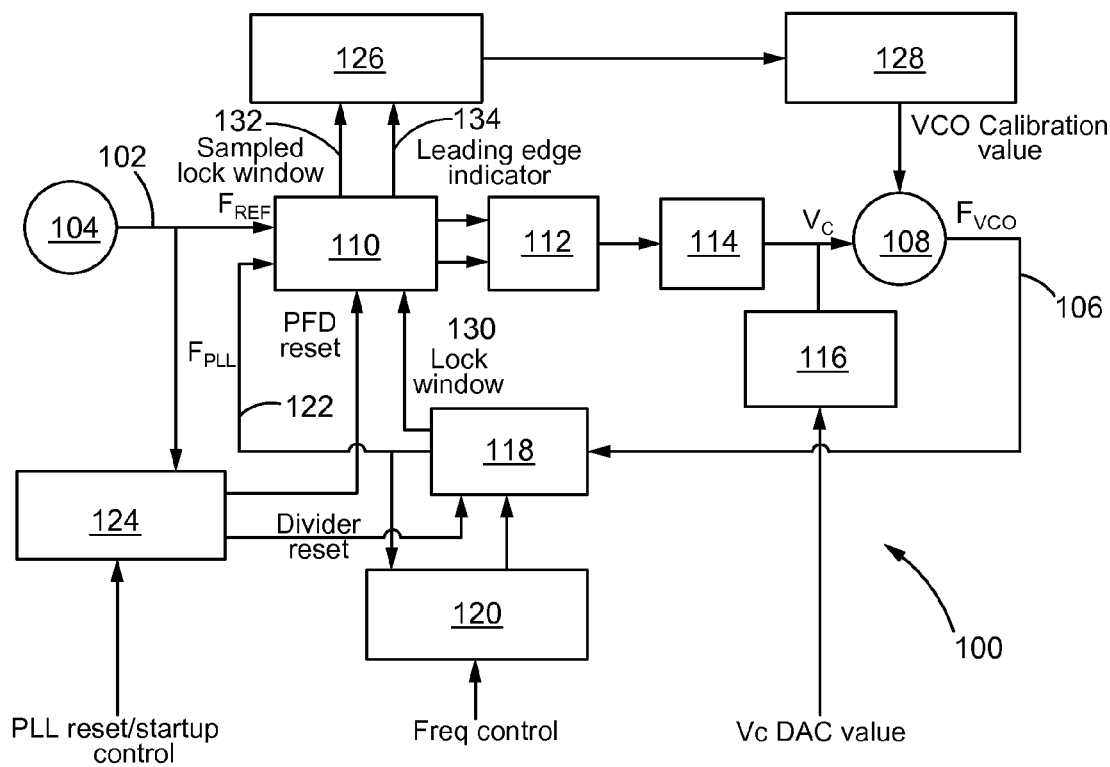
FIG. 1 is a schematic view of one exemplary PLL device having a calibration controller and a frequency controller constructed in accordance with the examples of the present disclosure.

Referring to FIG. 1, one exemplary embodiment is disclosed of a phase-locked loop (PLL) device 100 which may be used to generate a stable output frequency based on a given reference frequency. More particularly, the PLL 100 is configured to detect the relative phase or frequency of a given clock or reference signal 102, such as a signal provided by a crystal oscillator 104, or the like, and to generate an output signal 106 which corresponds to the detected phase or frequency of the reference signal 102. As shown, the PLL device 100 includes a local oscillator 108, a phase detector 110, a charge pump 112, a loop filter 114, a calibration converter 116, a feedback divider 118 and divider circuitry 120, among other basic circuitry, which form a feedback signal 122 in a feedback loop for monitoring the phase offset between the reference signal 102 and the output signal 106.

As shown, the output signal 106 is generated by a local oscillator 108, such as a voltage-controlled oscillator (VCO) or any other suitable oscillator having variable frequency output. The output signal 106 of the VCO 108 is fed back into an input of the phase detector 110 in the form of the feedback signal 122. The phase detector 110 additionally receives the reference signal 202 provided by the reference or crystal oscillator 104 at a second input thereof, and compares the phase of the reference signal 102 with the phase of the feedback signal 122. For example, the phase detector 110 may be configured to compare a significant edge of the reference signal 102 relative to a significant edge of the feedback signal 122. The significant edge can be either the rising or the falling edge. Based on the comparison, the phase detector 110 is configured to determine a phase offset, if any, and communicate a signal corresponding to the phase offset to the charge pump 112.

Based on the phase offset determined by the phase detector 110, the charge pump 112 is configured to generate a signal that is proportional to the phase offset and communicate the signal to the loop filter 114. In turn, the loop filter 114 generates a filtered voltage or current signal based on the output of the charge pump 112 configured to appropriately adjust the VCO 108 and compensate for any existing phase offset. For example, the signal generated by the phase detector 110, the charge pump 112 and the loop filter 114 causes the VCO 108 to increase the output frequency if the significant edge, such as the rising edge, of the reference signal 102 leads relative to that of the feedback signal 122. If the rising edge of the reference signal 102 lags relative to that of the feedback signal 122, the loop filter 114 can cause the VCO 108 to decrease the output frequency, and thereby reduce any phase offset between the reference signal 102 and the output signal 106 generated by the PLL 100 per iteration or cycle.

Still referring to FIG. 1, the PLL device 100 additionally includes a calibration converter 116, provided in the form of a digital to analog converter (DAC), or the like, that is selectively coupled to the VCO 108. The calibration converter 116 can be used to apply an initial condition to an input of the VCO 108 during calibration and startup. The PLL device 100 further includes a feedback divider 118 and related divider circuitry 120 disposed along the feedback loop in between the VCO 108 and the phase detector 110. The feedback divider 118 and divider circuitry 120 may be configured to scale, such as down-divide, the frequency of the output signal 106 by appropriate ratios, thereby generating a feedback signal 122 to be input to the phase detector 110 and compared with the reference signal 102.

The PLL device 100 of FIG. 1 also includes a reset controller 124 in communication with the reference clock or oscillator 104 and operatively coupled to each of the phase detector 110 and feedback divider 118. The reset controller 124 operates during calibration and lock detection of the PLL 100 and selectively engages each of the phase detector 110 and the feedback divider 118 in a manner which prequalifies the output signal 106 provided by the VCO 108. For example, the reset controller 124 is configured to simultaneously maintain at least each of the phase detector 110 and the feedback divider 118 in a reset or an inactive state of operation during calibration, monitor the clock or reference signal 102, and release each of the phase detector 110 and the feedback divider 118 such that the first edge of the output of the feedback divider 118 is substantially in line with the next anticipated and active reference clock.

As shown in FIG. 1, the PLL device 100 additionally includes a calibration controller 126 as well as a frequency controller 128 adapted to further manage the PLL 100 during at least calibration and phase-lock detection operations. The calibration controller 126 is disposed in direct communication between the phase detector 110 and the frequency controller 128, and the frequency controller 128 is operatively coupled to an input of the local oscillator or VCO 108. Moreover, the calibration controller 126 and the frequency controller 128 may serve to finely adjust the output frequency range of the VCO 108 according to the relative offset in phase between the feedback signal 122 and the reference signal 102 (as determined by a lock window that is defined about the significant edge of the feedback signal 122), and using, for example, a capacitor array in conjunction with a code search strategy as discussed in more detail further below.

As shown in FIG. 1, for example, each of the feedback divider 118 and the phase detector 110 is configured to additionally communicate a lock window signal 130 therebetween. In particular, the feedback divider 118 is configured to generate a lock window signal 126 which defines an active lock window around each significant edge, such as the rising edge, of the feedback signal 122 to be communicated to an input of the phase detector 110. For example, each lock window of the lock window signal 130 is preconfigured to have an active duration which extends a fraction of one cycle of the feedback signal 120 on each side of the rising edge thereof. Moreover, each lock window defines a range of frequencies of the feedback signal 122 which, if coincident with the target frequency or the frequency of the reference signal 102, may be deemed to be within allowable phase offset limits and in substantial phase-lock with the reference signal 102.

Upon receiving the lock window signal 130, the phase detector 110 is configured to sample the lock window signal 130 at each significant edge of the reference signal 102, and generate a sampled window signal 132 based on the collective samples. For example, the sampled window signal 132 is active for each iteration or cycle the rising edge of the reference signal 102 coincides with one of the lock windows of the lock window signal 130, and otherwise inactive. In addition, the phase detector 110 is configured to compare the reference signal 102 with the feedback signal 122, and generate a leading edge indicator 134 based on the relationship between the corresponding rising or otherwise significant edges thereof. For example, the phase detector 110 is configured to output a leading edge indicator 134 that is active for each iteration or cycle the rising edge of the reference signal 102 leads relative to the rising edge of the feedback signal 122, and inactive for each iteration or cycle the rising edge of the reference signal 102 lags relative to the rising edge of the feedback signal 122.

Based on the sampled window signal 132 and the leading edge indicator 134, the calibration controller 126 of FIG. 1 provides further analysis of the relationships between the reference signal 102 and the feedback signal 122 in an embodiment. For example, if the sampled window signal 132 is active for a given cycle, the calibration controller 126 determines that the phase offset between the reference signal 102 and the feedback signal 122 for that particular cycle is within acceptable limits and counts toward a phase-lock designation. Conversely, if the sampled window signal 132 is inactive for a given cycle, the calibration controller 126 determines that the phase offset between the reference signal 102 and the feedback signal 122 for that particular cycle exceeds the desired limits and counts against a phase-lock designation.

When the sampled window signal 132 is inactive and the phase offset is determined to exceed desired limits, the calibration controller 126 is configured to first examine the available calibration space to assess whether further calibration measurements are possible. If such calibration space permits, the calibration controller 126 proceeds to detect the current state of the leading edge indicator 134, and updates the local oscillator 108 according to the determined state of the leading edge indicator 134. The calibration controller 126 may thereby enable the feedback signal 122 to be re-synchronized to the reference signal 102 and continue the calibration process. If, however, the calibration space has been exhausted, the calibration controller 126 may immediately abort further calibration measurements and provide the appropriate indications of the error.

The calibration controller 126 is further configured in an embodiment to track consecutive cycles of the sampled window signal 132 to assess whether the PLL device 100 is sufficiently in phase-lock. The number of consecutive cycles of the sampled window signal 132 that are active directly corresponds to the agreement in frequency and phase between the reference signal 102 and the feedback signal 122. For example, a greater number of consecutively active cycles of the sampled window signal 132 may indicate a lower phase offset, and a greater number of consecutively inactive cycles of the sampled window signal 132 may indicate a greater phase offset.

Furthermore, if the tracked number of consecutively active cycles of the sampled window signal 132 exceeds corresponding thresholds, the calibration controller 126 is configured to confirm phase-lock until at least an inactive cycle of the sampled window signal 132 is detected. Alternately, if the tracked number of consecutively inactive cycles of the sampled window signal 132 exceeds corresponding thresholds, the calibration controller 126 immediately terminates further analysis. Additionally or optionally, the calibration controller 126 generates a flag or any other suitable indicator to indicate that phase-lock is lost and/or suggest recalibration.

In accordance with the embodiment shown in FIG. 1, the PLL device 100, or at least the phase detector 110, feedback divider 118, calibration controller 126 and frequency controller 128 thereof, are configured to perform oscillator calibration and phase-lock according to a predetermined set of instructions, algorithms, coded processes, or the like. One such exemplary algorithm or method 136 of operating the PLL device 100 during calibration or lock detection is diagrammatically provided in FIG. 2. Additionally, the method 136 of FIG. 2 is performed in conjunction with other schemes for operating the PLL 100, such as upon the completion of a reset scheme, synchronization scheme, or the like, such that the lock window signal 130, sampled window signal 132 and leading edge indicator 134, among others, correspond to a prequalified or a substantially synchronized feedback signal 122.

Figure 2:
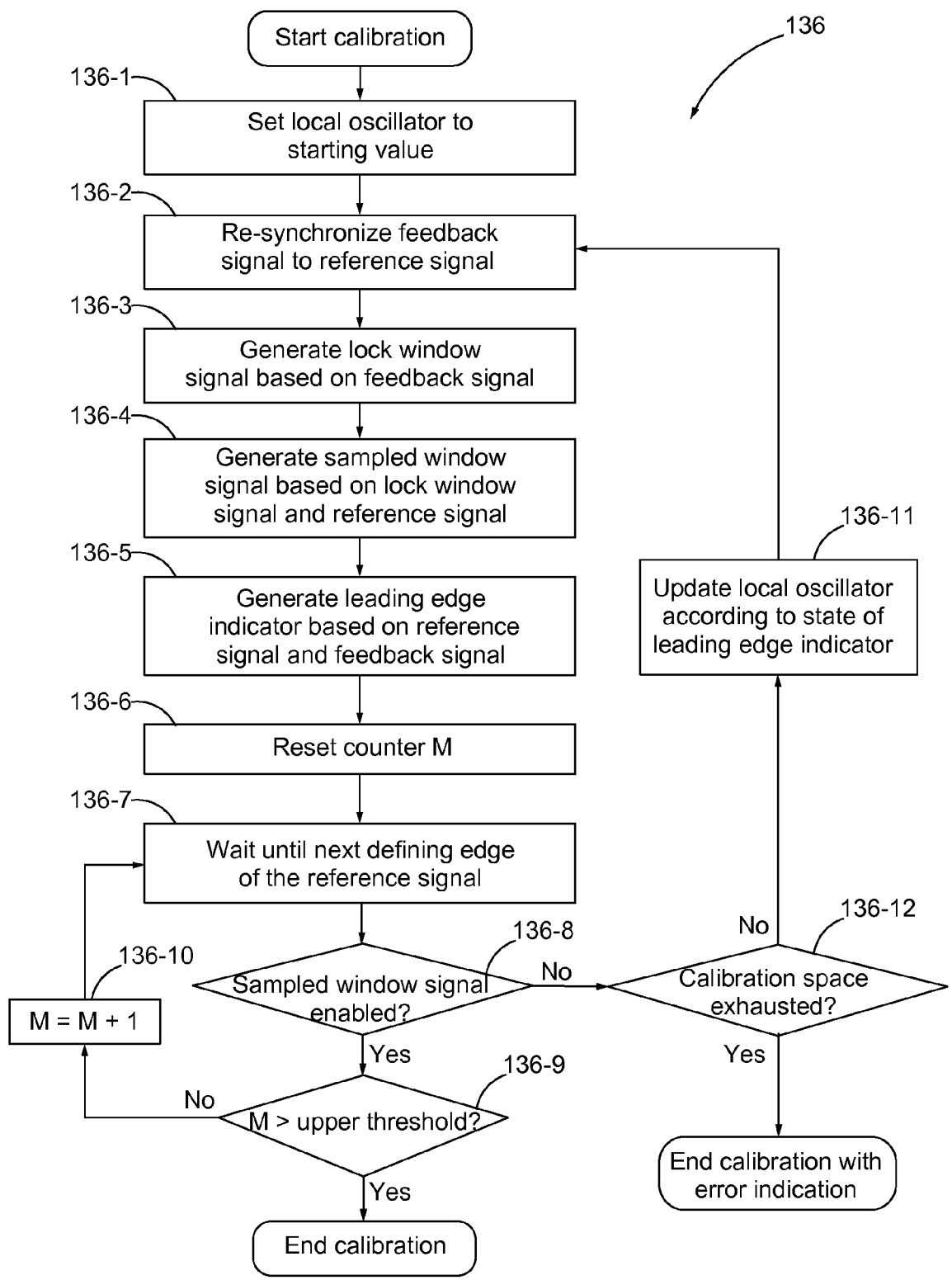
FIG. 2 is a flow diagram of one exemplary method of performing calibration of a local oscillator and lock detection on a PLL device.

As shown in the example calibration of FIG. 2, the local oscillator 108 of the PLL device 100 is initially set to a starting value in block 136-1. The PLL device 100 is further configured to synchronize the feedback signal 122 in accordance with the reference signal 102 in block 136-2. Once the feedback signal 122 is in substantial synchronization with the reference signal 102, the PLL device 100 is configured to generate a lock window signal 130 based on the feedback signal 122 in block 136-3, e.g., at the feedback divider 118 of FIG. 1. The PLL device 100 is additionally configured to generate a sampled window signal 132 based on a sampling of the lock window signal 130 with the reference signal 102 in block 136-4, and to generate a leading edge indicator 134 based on a comparison of the reference signal 102 and the feedback signal 122 in block 136-5. In subsequent blocks, the calibration controller 126 is configured to determine the state of the sampled window signal 132 for the given cycle, and more particularly, to begin or continue counting the number of consecutive cycles or samples within the sampled window signal 132 that are active. Moreover, the calibration controller 126 compares the number of consecutive active samples to predefined thresholds to determine the degree of agreement between the reference signal 102 and the feedback signal 122 and to determine the appropriate response. Furthermore, it will be understood that other sequences of the method blocks shown in FIG. 2 are possible and that any two or more of the method blocks shown may be performed concurrently.

In one example, the PLL device 100 is configured to begin the counting process by resetting a counter value M in block 136-6, and waiting for the next defining or significant edge of the reference signal 102 in block 136-7. The PLL device 100 is additionally configured to determine if the sampled window signal 132 is active at that significant edge in block 136-8, and determine if the counter value M has exceeded a predefined upper threshold in block 136-9. If the sampled window signal 132 is active at the significant edge of the reference signal 102 for a given iteration, and if the counter value M has not yet exceeded a predefined upper threshold, the PLL device 100 increments the counter value M by one in block 136-10 and continues waiting for a subsequent significant edge of the reference signal 102. In such a manner, blocks 136-7, 136-8, 136-9 and 136-10 can be repeated for each iteration the sampled window signal 132 is active so long as the counter value M remains less than or equal to the upper threshold. If or once the counter value M exceeds the predefined upper threshold, the PLL device 100 immediately ceases further calibration measurements.

If, however, the sampled window signal 132 at the significant edge of the reference signal 102 is not active at any time during block 136-8 of the counting process for any given iteration, the PLL device 100 is configured to update the local oscillator 108 according to the state of the leading edge indicator 134 in block 136-11, and further return to block 136-2 to re-synchronize the feedback signal 122 to the reference signal 102. In further embodiments, the PLL device 100 may be configured to first assess whether the associated calibration space has been exhausted in block 136-12 and determine if additional calibration measurements are possible prior to proceeding to the update block of 136-11. If the calibration space has been exhausted, the PLL device 100 may be configured to cease further calibration measurements but also provide indication of the corresponding error.

Figure 3:
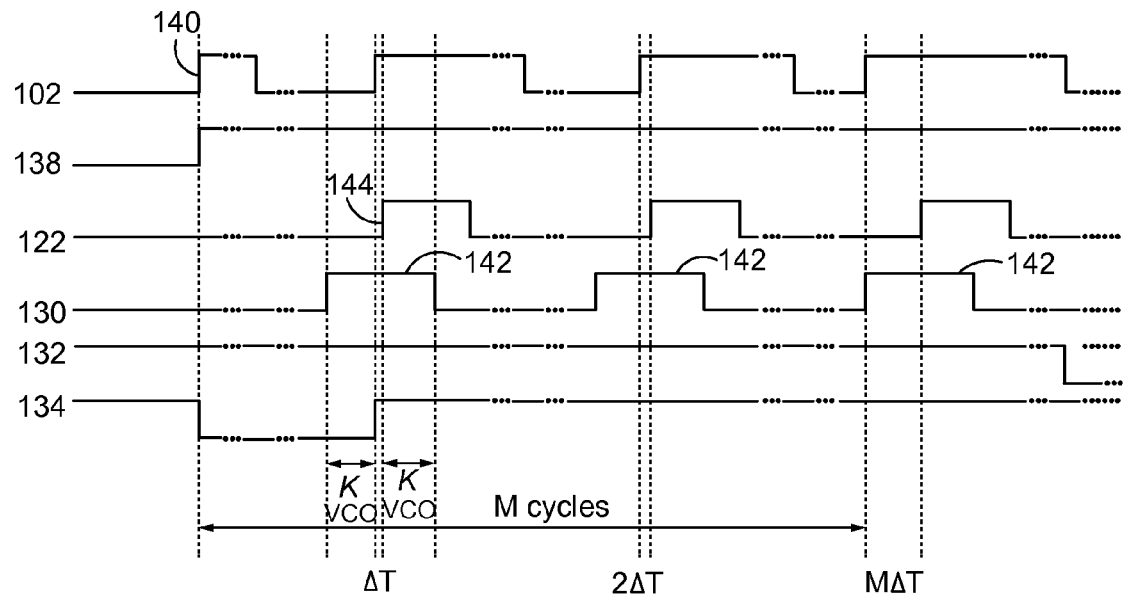
FIG. 3 is a graphical view illustrating the application of lock windows during calibration of the local oscillator of a PLL device.

Turning to FIG. 3, this figure provides a graphical illustration of an exemplary application of the calibration method 136 utilizing a capacitor array and a successive approximation register (SAR) code search strategy to implement the calibration controller 126 and frequency controller 128 of FIG. 1, for example. More specifically, calibrations on the capacitor array can be performed using a SAR search strategy that is modified to perform earlier termination of bits corresponding to large frequency or phase error so as to minimize overall calibration time.

To further facilitate calibrations, the SAR search strategy is configured to commence upon completion of a reset or a synchronization between the reference signal 102 and the feedback signal 122. As shown in FIG. 3, such a synchronized reset signal 138 of the frequency divider 118 is released approximately in synchronization with the significant edge 140 of the reference signal 102.

The lock window signal 130 is configured with active lock windows 142, where each lock window 142 is approximately centered about the significant edge 144 of the feedback signal 122 and extends a fraction of one cycle of the feedback signal 120 on each side thereof, for instance, for a given number of VCO cycles, K. If, upon release, the output frequency of the VCO 108 is at the desired target frequency, each significant edge 140 of the reference signal 102 coincides with each significant edge 144 of the feedback signal 122. If, however, a frequency offset exists between the reference signal 102 and the feedback signal 122, cumulative timing differences progressively shift the significant edge 140 of the reference signal 102 out of synchronization with the significant edge 144 of the feedback signal 122, and outside of the lock windows 142 of the lock window signal 130.

Further details regarding such phase offset or frequency errors are determined by assessing the leading edge indicator 134 and the sampled window signal 132. For instance, the leading edge indicator 134 is used to determine if the output frequency of the VCO 108 leads or lags relative to the reference frequency. The sampled window signal 132 is used to determine the number of cycles or samples the significant edge 140 of the reference signal 102 coincide with, or fail to coincide with, the lock windows 142 of the lock window signal 130, and thereby approximate the magnitude of the mismatch. Based on the magnitude of the mismatch, the SAR search strategy can accelerate calibrations by shortening analyses. For instance, if the sampled window signal 132 is inactive, denoting a significant phase or frequency mismatch, the SAR search strategy immediately aborts further measurements at the current code and moves onto the next code. If the sampled window signal 132 remains active for several consecutive cycles, denoting a minimal phase or frequency mismatch, the SAR search strategy ceases further calibrations.

In qualifying a phase-lock between the reference signal 102 and the output signal 106, a threshold against which the number of consecutive active cycles or samples of the sampled window signal 132 may be gauged is first determined. With reference to FIG. 3, for example, the threshold is assessed based on $$M \cdot |\Delta T| \approx \frac{K}{N} \cdot T_{FPLL} \tag{1}$$

where M is the number of active cycles of the sampled window signal 132, K is the number of VCO cycles by which the lock window extends on each side of the significant edge 144, N is the division factor of the feedback divider 118, ΔT is the difference between the period of the feedback signal and the reference signal, and $T_{FPLL}$ is the period of the feedback signal 122. Equation (1) can be rewritten in terms of frequency as:

$$|F_{PLL} - F_{REF}| \approx F_{REF} \frac{K}{M \cdot N} \tag{2}$$

where $F_{PLL}$ is the frequency of the feedback signal 122, and $F_{REF}$ is the frequency of the reference signal 102.

Assuming that the output frequency is to be less than an error of $F_{ERR}$ within the reference frequency, equation (2) is rewritten as:

$$|F_{VCO} - N \cdot F_{REF}| < F_{ERR} \tag{3}$$

$$|F_{PLL} - F_{REF}| < \frac{F_{ERR}}{N} \tag{4}$$

where $F_{VCO}$ is the output frequency of the local oscillator or VCO 108. Based on equations (2) and (4) above, an approximation for M is obtained by the expression:

$$M < \frac{K \cdot F_{REF}}{F_{ERR}} \tag{5}$$

For example, if $F_{REF}$ is 40 MHz, K is 12 and $F_{ERR}$ is 8 MHZ, the SAR search strategy performs a search within the capacitor array for output frequency control settings capable of producing at least 60 active cycles of the sampled window signal 132.

Still further, in capacitor array applications employing, for example, 8-bit tuning codes and a VCO 108 with an output frequency that is substantially linear relative thereto, the output frequency of the VCO 108 can be estimated as:

$$F_{VCO} = F_{min} + \frac{C}{256}(F_{max} - F_{min}) \tag{6}$$

where $F_{min}$ is the lower limit of the frequency range, $F_{max}$ is the upper limit, and C is the tuning code to be applied. Based in part on equation (2), the correct tuning code for the capacitor array can be extrapolated once M is determined, for instance, via equation (5). Moreover, the code or appropriate tuning value to be applied is determined based on the expression:

$$C = C' \pm \frac{F_{REF} \cdot K \cdot 256}{M \cdot (F_{max} - F_{min})} \tag{7}$$

where C' is the current tuning code. Algorithms based on the foregoing or other comparable strategies may be implemented to exhibit relatively quicker convergence than conventional means.

From the foregoing, it will be appreciated that certain embodiments have been set forth for the purposes of illustration, but that alternatives and modifications will also be apparent from the above description to those skilled in the art. These and other alternatives are considered equivalents and within the spirit and scope of this disclosure and the appended claims.

What is claimed is:

1. A method of calibrating a phase-locked loop (PLL) having at least a frequency divider, the method comprising:
    generating a lock window signal based on a feedback signal generated by the frequency divider, the lock window signal forming an active lock window relative to each significant edge of the feedback signal;
    generating a sampled window signal based on samples of the lock window signal at each significant edge of a reference signal; and
    estimating a phase offset between the reference signal and the feedback signal based on a number of consecutive samples of the sampled window signal that are active.

2. The method of claim 1, wherein a given calibration measurement is immediately aborted if the number of consecutive samples of the sampled window signal that are active is less than a predefined lower limit corresponding to excessive phase or frequency offset.

3. The method of claim 1, wherein each significant edge is one of a rising edge and a falling edge.

4. The method of claim 1, wherein each active lock window extends a predefined fraction of a period of the feedback signal and is approximately centered about the significant edge of the feedback signal.

5. The method of claim 1, wherein further calibration measurements are immediately aborted if the number of consecutive samples of the sampled window signal that are active is greater than a predefined upper limit corresponding to phase-lock.

6. The method of claim 1, wherein further calibration measurements are immediately aborted if an associated calibration space has been exhausted and if the number of consecutive samples of the sampled window signal that are active is less than a predefined lower limit corresponding to excessive phase or frequency offset.

7. The method of claim 1, further comprising generating a leading edge indicator based on a comparison between the significant edge of the reference signal and the significant edge of the feedback signal, and adjusting an output frequency of a local oscillator based on a state of the leading edge indicator.

8. The method of claim 7, wherein the output frequency of the local oscillator is increased if the state of the leading edge indicator indicates the reference signal to be leading relative to the feedback signal, and decreased if the state of the leading edge indicator indicates the reference signal to be lagging relative to the feedback signal.

9. A method of calibrating a phase-locked loop (PLL) having at least a frequency divider and a local oscillator, the method comprising:
sampling of a lock window signal at each significant edge of a reference signal, the lock window signal forming an active lock window approximately centered about each significant edge of a feedback signal generated by the frequency divider;
determining a number of consecutive samples of the lock window signal that are active;
updating the local oscillator based on a state of the feedback signal if the number of consecutive active samples is less than a predefined lower limit corresponding to excessive phase offset; and
aborting calibration measurements if the number of consecutive active samples is greater than a predefined upper limit corresponding to phase-lock.

10. The method of claim 9, further comprising generating a leading edge indicator based on a comparison between the significant edge of the reference signal and the significant edge of the feedback signal, and adjusting an output frequency of a local oscillator based on a state of the leading edge indicator.

11. The method of claim 10, wherein the local oscillator is updated based on the state of the feedback signal as indicated by the leading edge indicator.

12. The method of claim 9, wherein the local oscillator is updated if an associated calibration space has not been exhausted, and wherein further calibration measurements are immediately aborted with a corresponding error indication if the calibration space has been exhausted.

13. The method of claim 9, wherein each active lock window extends a predefined fraction of a period of the feedback signal and is approximately centered about the significant edge of the feedback signal.

14. A phase-locked loop (PLL), comprising:
a local oscillator configured to generate an output signal;
a feedback divider configured to generate a feedback signal and a lock window signal in response to the output signal;
a phase detector configured to operate the local oscillator based on a comparison between a reference signal and the feedback signal, and generate a sampled window signal based on samples of the lock window signal with the reference signal; and
a calibration controller configured to determine a number of consecutive samples in the sampled window signal that are active, and estimate a phase offset based on the number of consecutive active samples.

15. The PLL of claim 14, wherein the calibration controller is further configured to update the local oscillator according to a state of the feedback signal relative to the reference signal if the number of consecutive active samples is less than a predefined lower limit corresponding to excessive phase offset, and aborting calibration measurements if the number of consecutive active samples is greater than a predefined upper limit corresponding to phase-lock.

16. The PLL of claim 14, wherein the calibration controller is further configured to determine whether an associated calibration space has been exhausted, the calibration controller being configured to update the local oscillator if the calibration space has not been exhausted, and abort further calibration measurements with a corresponding error indication if the calibration space has been exhausted.

17. The PLL of claim 14, wherein the phase detector is further configured to generate a leading edge indicator based on a comparison between the reference signal and the feedback signal, and the calibration controller is further configured to adjust an output frequency of the local oscillator based on a state of the leading edge indicator.

18. The PLL of claim 17, wherein the output frequency of the local oscillator is increased if the state of the leading edge indicator indicates the reference signal to be leading relative to the feedback signal, and decreased if the state of the leading edge indicator indicates the reference signal to be lagging relative to the feedback signal.

19. The PLL of claim 17, wherein the calibration controller further comprises a frequency controller configured to adjust the output frequency of the local oscillator in response to the sampled window signal and the leading edge indicator.

20. The PLL of claim 14, wherein the phase detector and the frequency divider are concurrently released in approximate synchronization with a significant edge of the reference signal.

* * * * *